(12) United States Patent
Goth et al.

(10) Patent No.: US 7,808,783 B2
(45) Date of Patent: Oct. 5, 2010

(54) MULTIPLE CHIP MODULE COOLING SYSTEM AND METHOD OF OPERATION THEREOF

(75) Inventors: Gary F. Goth, Pleasant Valley, NY (US); Daniel J. Kearney, Ulster Park, NY (US); Paul M. Lucas, Beacon, NY (US); Donald W. Porter, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 12/036,572

(22) Filed: Feb. 25, 2008

(65) Prior Publication Data

US 2009/0219681 A1    Sep. 3, 2009

(51) Int. Cl.
*H05K 7/20* (2006.01)
(52) U.S. Cl. .................. 361/700; 361/699; 62/129; 165/80.3
(58) Field of Classification Search .......... 361/679.49, 361/695, 697, 699, 700, 719, 726
See application file for complete search history.

(56) References Cited

U.S. PATENT DOCUMENTS

| | | | |
|---|---|---|---|
| 6,035,655 A | 3/2000 | Hare et al. | |
| 6,167,621 B1 | 1/2001 | Goth et al. | |
| 6,213,194 B1 * | 4/2001 | Chrysler et al. | 165/80.3 |
| 6,343,478 B1 | 2/2002 | Chang | |
| 6,397,618 B1 | 6/2002 | Chu et al. | |
| 7,074,123 B2 | 7/2006 | Bettridge et al. | |
| 7,327,578 B2 | 2/2008 | Novotny | |
| 2004/0016241 A1 * | 1/2004 | Street et al. | 62/129 |
| 2007/0297136 A1 * | 12/2007 | Konshak | 361/699 |
| 2008/0205003 A1 * | 8/2008 | Belady | 361/700 |

* cited by examiner

*Primary Examiner*—Jayprakash N Gandhi
*Assistant Examiner*—Courtney Smith
(74) *Attorney, Agent, or Firm*—Cantor Colburn LLP; Gerry Monteleone (57) ABSTRACT

Disclosed herein is computer system having a first and second multiple chip modules (MCM) and a cooling module. The cooling module includes a first cooling loop associated with said first MCM and a first evaporator. The cooling module further includes a second cooling loop associated with said second MCM and a second evaporator. Each cooling loop is coupled to a common condenser that receives thermal energy from each cooling loop. A controller is coupled to the first and second cooling loop and adapts the operation of the first and second cooling loop in response to variances in operating conditions to provide cooling of the first and second MCM.

13 Claims, 5 Drawing Sheets

FIG. 8

MULTIPLE CHIP MODULE COOLING SYSTEM AND METHOD OF OPERATION THEREOF

BACKGROUND

This disclosure relates to a cooling system for a computer system having multiple chip modules and in particular to a cooling system having a first and second cooling loop that share a common condenser and have a controller that adapts the operation of the cooling system to maximize efficiency and reliability.

The use of complementary metal-oxide-semiconductor ("CMOS") based microprocessors has allowed large advances in the construction and operation of computer systems. CMOS semiconductors dissipate less power than prior art semiconductors such as bipolar circuits. The use of CMOS semiconductors therefore allows denser packaging and faster circuits. These advances are further aided by the characteristics of CMOS semiconductors that allows faster operating speeds when the microprocessor is cooled and thermal energy is removed during operation.

Recently, the use of multiple chip modules (MCM) in computer systems has allowed additional increases in speed and processing power. However, these MCM systems also generate significant amounts of heat. Since there is a demand to run the MCM systems at higher speeds, the clock frequencies of these devices must be correspondingly higher. Unfortunately, the thermal energy generated by an MCM system rises in proportion to the microprocessor clock speed. Thus, the demand for higher clock speeds requires maintaining the microprocessor at consistent low temperature that places strains on the cooling systems of these MCM systems. These issues are further compounded by the desire for the cooling systems to be efficient and highly reliable.

Typically, a cooling system for this type of computer system was arranged to support multiple MCM systems. This arrangement typically included a single reciprocating compressor coupled to a condenser. Multiple cooling loops were manifolded to the outlet of the condenser allowing the cooling of the individual MCM systems. Each of the cooling loops are manifolded back together at the inlet to the compressor. While this system met the desired cooling requirements, the compressor is often under utilized since it is designed to meet maximum heat load requirements for each supported MCM system. By operating the cooling system at levels significantly less than the designed performance levels, the efficiency and reliability of the cooling system decreases.

While existing computer cooling systems are adequate for their intended purposes, it is desirable to have a computer system that can be cooled by a compact and reliable cooling system having separate cooling loops to provide increased reliability and efficiency. It is further desirable for the cooling system to be arranged in a manner that allows adjustment of the operation of the cooling loops to compensate for higher heat loads in one of the MCM's. In addition, it is desirable for the cooling system to be arranged so that the individual cooling loops provide a redundancy in the event of a failure in one cooling loop.

SUMMARY

A cooling system for a computer is provided having a first cooling loop. The first cooling loop includes a first expansion valve fluidly coupled with a first compressor and a temperature sensor. A second cooling loop is also provided having a second expansion valve fluidly coupled to a second compressor. A condenser is coupled to the first and second cooling loops. A controller is operably coupled to the first and second expansion valves, wherein the controller is responsive to executable instructions to adjust the first expansion valve in response to a signal from the first temperature sensor.

A computer system is also provided having a first multiple chip module (MCM) and a second MCM positioned adjacent the first MCM. A first evaporator having a first expansion orifice is thermally coupled to the first MCM. A second evaporator having a second expansion orifice is thermally coupled to the second MCM. A condenser is thermally coupled to the first and second evaporators. A first cooling loop is coupled between the condenser and the first evaporator. The first cooling loop has a first expansion valve. A second cooling loop is coupled between the condenser and the second evaporator. The second cooling loop has a second expansion valve. A refrigeration controller is operably coupled to the first expansion valve and the second expansion valve.

A method of operating a computer cooling system having a first MCM and a second MCM is also provided. The method includes compressing a first refrigeration fluid in a first cooling loop to a high-pressure gas. The first refrigerant is condensed to a high-pressure liquid with a condenser. The first refrigeration fluid is then expanded from a high-pressure liquid to a first low pressure liquid with a first expansion valve. The first refrigerant fluid is further expanded from the first low pressure liquid to a second low-pressure liquid with a first orifice. Thermal energy is absorbed from the first MCM into the first refrigeration fluid second low-pressure liquid to form a low-pressure gas.

The method compresses a second refrigeration fluid in a second cooling loop to a high-pressure gas. The second refrigerant is then condensed into a high-pressure liquid with the condenser. The second refrigeration fluid is expanded from a high-pressure liquid to a third low-pressure liquid with a second expansion valve. The second refrigerant is further expanded from the third low-pressure liquid to a fourth low-pressure liquid with a second orifice. Thermal energy is absorbed from the second MCM into the second refrigeration fluid fourth low-pressure liquid to form a low-pressure gas. The compression and expansion characteristics of the first refrigeration fluid are changed in response to a change in thermal energy produced by the first MCM.

DETAILED DESCRIPTION

The use of the terms "a" and "an" and "the" and similar references in the context of describing the invention (especially in the context of the following claims) are to be construed to cover both the singular and the plural, unless otherwise indicated herein or clearly contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Figure 1:
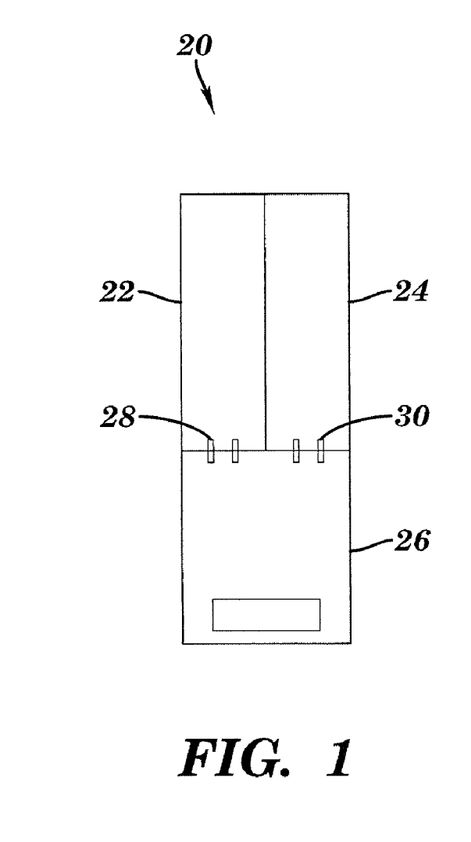
FIG. 1 is a plan front view of the modular computer system.
Figure 2:
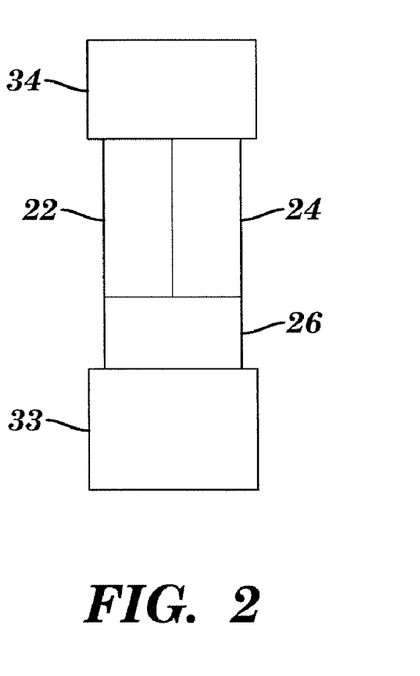
FIG. 2 is an plan rear view of the computer system of FIG. 1.
Figure 3:
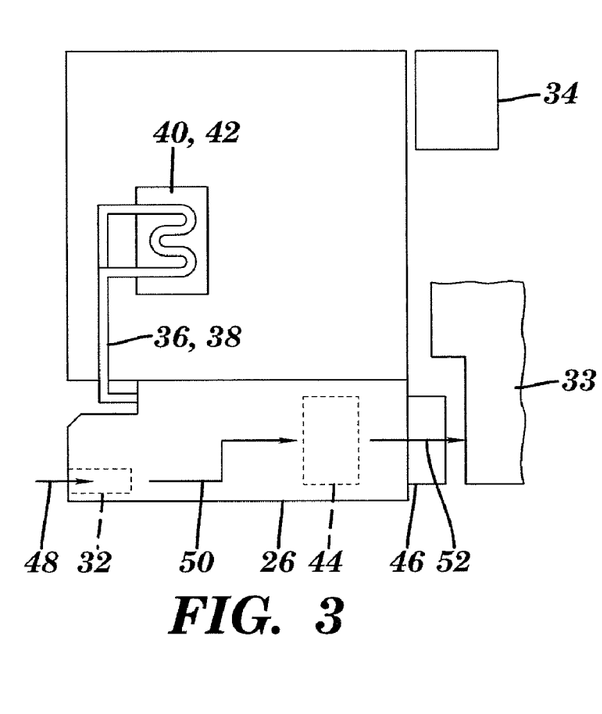
FIG. 3 is a plan side view of the computer system of FIG. 1.

With reference now to FIGS. 1-3, an exemplary depiction of the modular computer system 20 comprises a first multiple chip module node 22 ("MCM Node") and a second MCM Node 24 arranged side by side in a frame, cabinet or rack (not shown). An MCM Node is an electronic package including multiple integrated circuits that are packaged together in a manner that allows the system to operate as a single integrated circuit. It should be appreciated that while the embodiments discussed herein refer to an MCM Node, the claims are not so limited and apply equally to systems having single chip modules or other types of electronic packaging.

Each of the MCM Node's 22, 24 are coupled to a cooling module 26 by a pair of connectors 28, 30. In the exemplary embodiment, a controller 32 is removably mounted to the cooling module 26 in a manner that facilitates removal of the controller 32 for servicing and repair. A pair of air handling modules 33, 34 are coupled to the computer system 20 to provide air movement through the MCM Node's 22, 24. In one embodiment, the air handling modules 33, 34 provide a backup to the cooling module 26, in the event of a full or partial malfunction. This backup cooling allows the MCM Nodes 22, 24, either individually or simultaneously depending on the type of malfunction, to change their operation and reduce the heat load in a controlled manner to avoid disruption of the processes being executed.

As will be described in more detail below, the cooling module 26 includes two or more cooling loops 36, 38 that are connected between evaporators 40, 42 in the MCM Node's 22, 24 and a single condenser 44 in the cooling module 26. A blower 46 is arranged to draw air through the cooling module 26 and the condenser 44 to remove the heat from the cooling loops 36, 38. In the exemplary embodiment, air enters the cooling module 26 through the controller 32 as represented by the arrow 48. The air moves through the condenser 44 as represented by arrow 50 and exits through the blower 46 as represented by the arrow 52.

Figure 4:
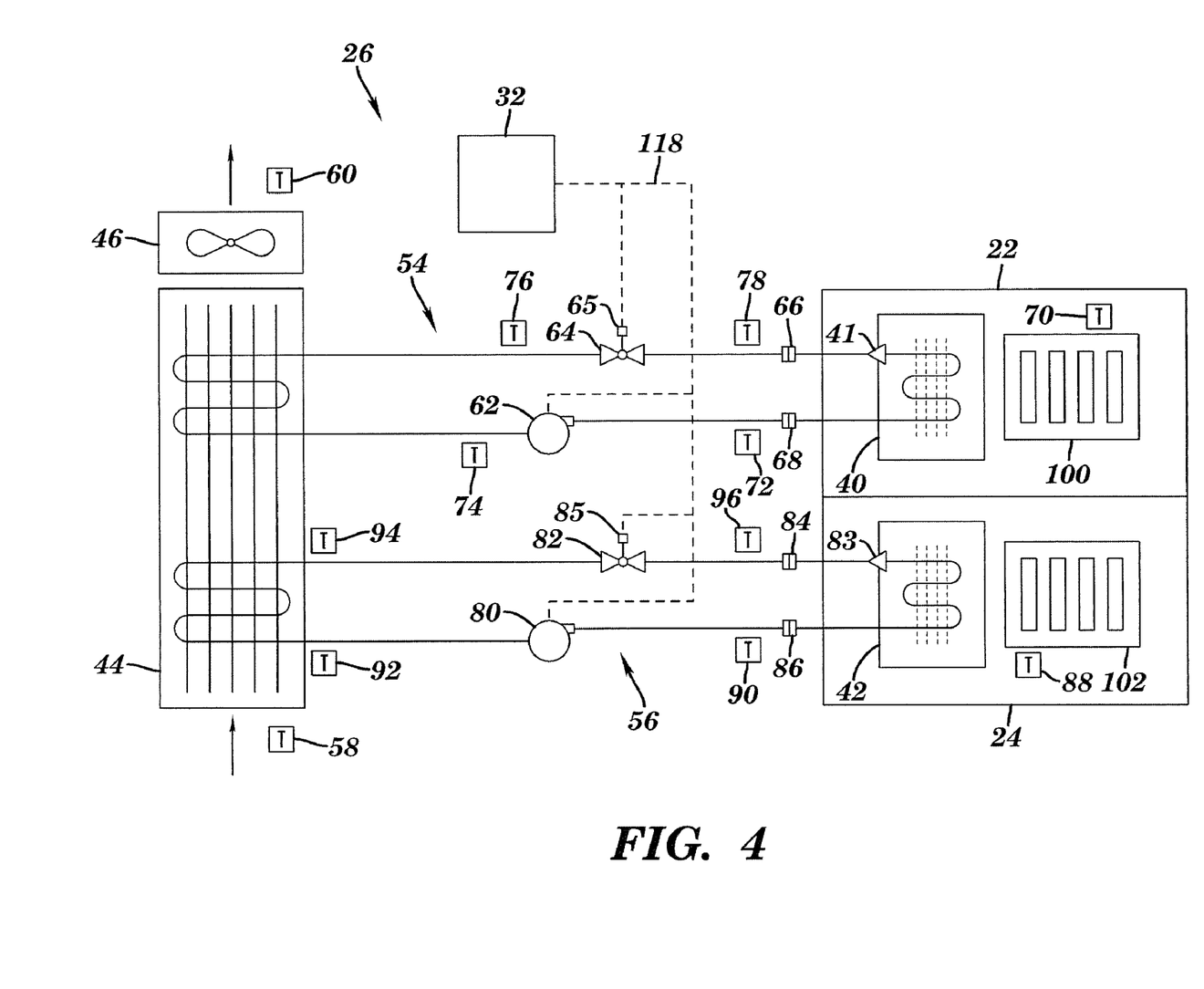
FIG. 4 is a schematic illustration of an exemplary embodiment cooling system for the computer system of FIG. 1.

The internal arrangement of the cooling module 26 is illustrated in FIG. 4. As discussed above, the blower pulls air through the cooling module 26 and across the condenser 44. A temperature sensor 58 may be arranged to measure the air temperature entering the condenser 44. A second temperature sensor 60 may be arranged to measure the air temperature exiting the condenser. It should be appreciated that the sensor 60 may be arranged either in the exhaust of the blower 46 or at the outlet side of the condenser 44.

Cooling module 26 also includes first and second cooling loops 54, 56 that are coupled between the condenser 44 and the evaporators 40, 42. It should be appreciated that while the discussion herein refers to two cooling loops, additional loops may also be incorporated without deviating from scope of the claims. Cooling loop 54 is arranged in a circuit to flow a refrigeration fluid from a compressor 62 through the condenser 44, an expansion valve 64, an expansion orifice 41, the evaporator 40 and then back to the compressor 62. A pair of couplings 66, 68, such as quick connect couplings for example, connect the portion of the first cooling loop 54 that is internal to the cooling module 26 with the portion internal to the first MCM Node 22. The refrigeration fluid may be, but is not limited to, ammonia; nitrogen; helium; sulfur hexaflouride; carbon dioxide; hydrochlorofluorocarbons; and chlorofluorocarbons; or the like.

The condenser 44 is a heat exchanger that extracts thermal energy from the refrigeration fluid and transfers it to the air being moved by blower 46. The condenser 44 may be but is not limited to, a shell and tube heat exchanger, a adiabatic wheel, or a plate heat exchanger. The refrigeration fluid enters the condenser 44 as a high pressure superheated gas/vapor from compressor 62. The exchange of thermal energy results in the gas condensing to a liquid state as it passes through the condenser 44. The refrigeration fluid then exits that condenser as a high pressure liquid.

The evaporator 40 is also a heat exchanger that transfers thermal energy from the MCM Node 22 to the refrigerant in cooling loop 54. As the high pressure liquid that exited the condenser passes through the expansion valve 64 and expansion orifice 41, the pressure of the liquid drops allowing evaporation of the liquid at a lower temperature. The liquid now absorbs thermal energy as it vaporizes and passes through the evaporator and exits the evaporator as a low pressure, low temperature gas. The compressor 62 compresses the refrigerant gas back into a high-pressure superheated gas and the cycle repeats. The orifice 41 is positioned at the inlet to the evaporator 40. In one embodiment, the orifice 41 is a fixed orifice. This arrangement allows the refrigerant fluid to remain at desirable temperatures inside the MCM Node without requiring thick insulation or forming condensation. The final expansion thus takes place at the MCM, the source of the heat load.

Cooling loop 54 may also include additional temperature sensors, such as but not limited to MCM sensor 70, low-pressure gas sensor 72, high-pressure gas sensor 74, high-pressure liquid sensor 76, and low-pressure liquid sensor 78. The temperature sensors can be, but are not limited to, thermocouples, thermistors, infrared thermometers or pyrometers. As will be discussed in more detail below, the temperature sensors provide a feedback mechanism to a controller 32 to allow the monitoring and control of the cooling module 26.

The evaporator 50 is thermally coupled to the multichip integrated circuit assembly (MCM) 100. As discussed above, in the exemplary embodiment, integrated circuit assembly 100 includes a plurality of processor-based integrated circuits. These processors are generally complementary metal-oxide-semiconductor ("CMOS") based microprocessors that generate heat when operating. One characteristic of the CMOS microprocessors is that cooling or reducing the temperature of the microprocessor may increase the operating speed of the microprocessor. Thus, through the combination of the MCM 100 with CMOS technology and adequate cooling, the processing power density of the MCM Node 22 may be greatly increased. In the exemplary embodiment, the cooling loop 54 maintains the evaporator temperature set point above the dew point for the system 20, at 29° C. with a tolerance of ±2° C. for example.

The second cooling loop 56 is arranged in a similar circuit manner to the first cooling loop 54. A compressor 80 flows refrigeration fluid through a circuit that includes the condenser 44, an expansion valve 82, an expansion orifice 83, the evaporator 42 and back to the compressor 80. Similarly a pair of couplings 84, 86 connect the portion of the second cooling loop 56 arranged internal to the cooling module 26 with the portion internal to the second MCM Node 24. Cooling loop 56 may also include additional temperature sensors, such as but not limited to, evaporator sensor 88, low-pressure gas sensor 90, high-pressure gas sensor 92, high-pressure liquid sensor 94, and low-pressure liquid sensor 96. As will be discussed in more detail below, the temperature sensors provide a feedback mechanism to a controller 32 to allow the monitoring and control of the cooling module 26.

The evaporator 42 is thermally coupled to a MCM 102. As discussed above with respect to evaporator 40 and integrated circuit assembly 100, the second cooling loop removes heat from the MCM 102 to maintain the microprocessors at a desired operating temperature. This provides the advantages of increasing processing power density as discussed above.

The operation of the cooling module 26 is provided by the controller 32. A block diagram of the control system 190 is illustrated in FIG. 4. The controller 32 is a suitable electronic device capable of accepting data and instructions, executing the instructions to process the data, and presenting the results. The controller 32 may include one or more processors 104. Controller 32 may accept instructions through a user interface, or through other means such as but not limited to electronic data card, voice activation means, manually-operable selection and control means, radiated wavelength and electronic or electrical transfer. Therefore, controller 32 can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, a personal digital assistant (PDA) or a hybrid of any of the foregoing.

Figure 5:
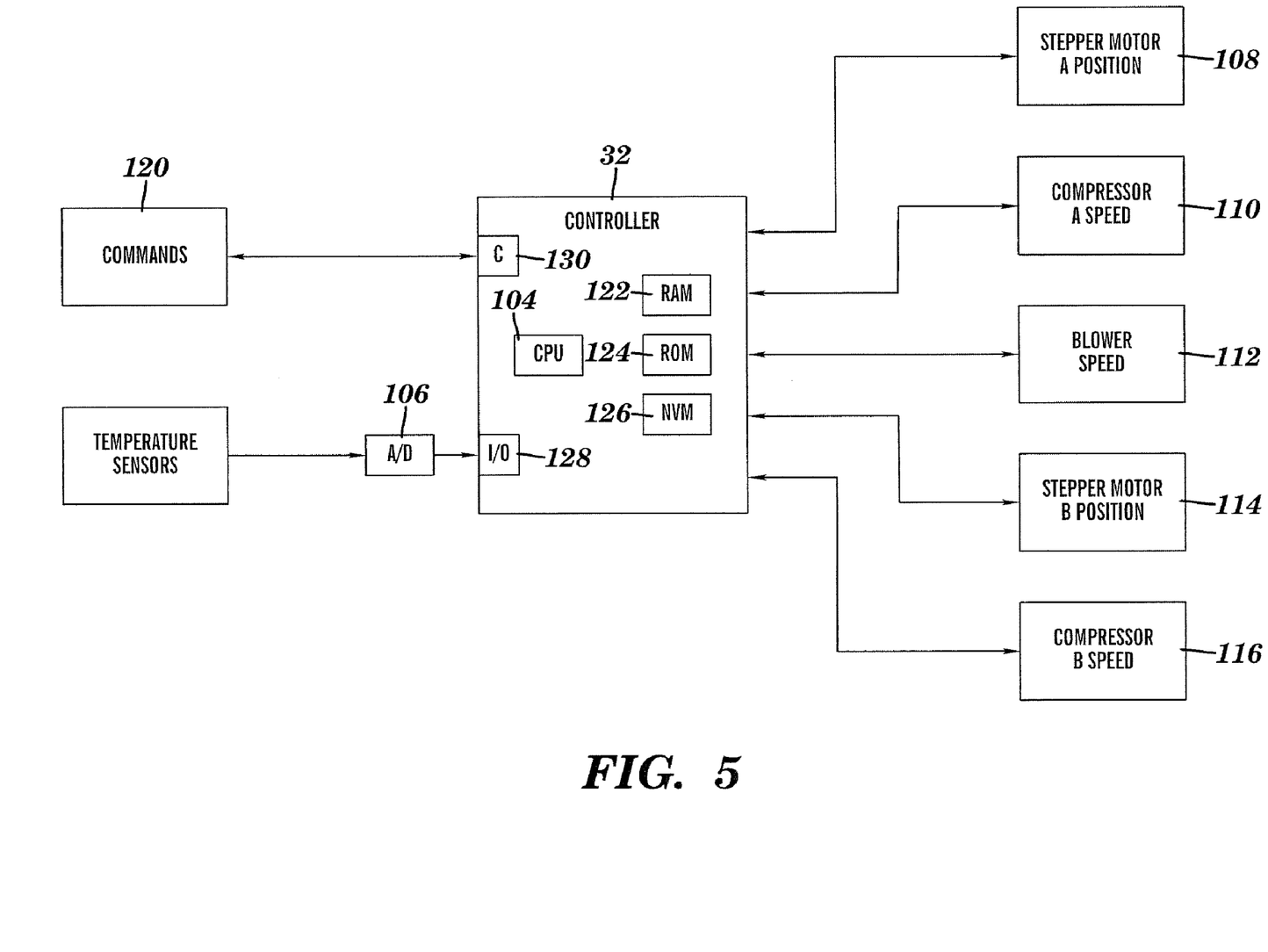
FIG. 5 is a block diagram illustrating the control system for the operation of the cooling system of FIG. 4.

Controller 32 is capable of converting the analog voltage or current level provided by sensors, such as temperature sensor 70 for example, into a digital signal indicative of the heat generated by MCM 100. Alternatively, sensor 70 may be configured to provide a digital signal to controller 32, or an analog-to-digital (A/D) converter 106 may be coupled between sensor 70 and controller 32 to convert the analog signal provided by sensor 70 into a digital signal for processing by controller 32. Controller 32 uses the digital signals as input to various processes for controlling the cooling module 26. The digital signals represent one or more cooling module 26 data including but not limited to stepper motor A position 108, compressor A speed 110, blower speed 112, stepper motor B position 114, compressor B speed 116, and the like.

Controller 32 is operably coupled with one or more components of cooling module 26 by data transmission media 118. Data transmission media 118 includes, but is not limited to, solid-core wiring, twisted pair wiring, coaxial cable, and fiber optic cable. Data transmission media 118 also includes, but is not limited to, wireless, radio and infrared signal transmission systems. In the embodiment shown in FIG. 4 and FIG. 5, transmission media 118 couples controller 32 to compressors 62, 80, expansion valves 64, 82 and temperature sensors 70-78, 88-96. Transmission media 118 may also connect the controller 32 to external devices 120 such as MCM Node's 22, 24 or a central control system. Controller 32 is configured to provide operating signals to these components and to receive data from these components via data transmission media 118. Controller 32 communicates over the data transmission media 118 using a well-known computer communications protocol such as Inter-Integrated Circuit (I2C), Serial Peripheral Interface (SPI), System Management Bus (SMBus), Transmission Control Protocol/Internet Protocol (TCP/IP), RS-232, ModBus, or any other communications protocol suitable for the purposes disclosed herein.

In general, controller 32 accepts data from sensors, such as temperature sensor 70 for example, and devices such as compressor 62 for example. Controller 32 is also given certain instructions from an executable instruction set for the purpose of comparing the data from sensor 70 to predetermined operational parameters such as a desired MCM operating state. Controller 32 provides operating signals to operate expansion valve 66. Controller 32 also accepts data from compressor 62, indicating, for example, whether the compressor motor is operating correctly. The controller 32 compares the operational parameters to predetermined variances (for example, motor current, valve position, evaporator temperature) and if the predetermined variance is exceeded, generates a signal that may be used to indicate an alarm or message to an external device 120. Additionally, the signal may initiate other control methods that adapt the operation of the cooling module 26 such as changing the operational state of valve 64 to compensate for the out of variance operating parameter.

Controller 32 includes a processor 104 coupled to a random access memory (RAM) device 122, a non-volatile memory (NVM) device 126, a read-only memory (ROM) device 124, one or more input/output (I/O) controllers 128, and a data interface device 130. I/O controllers 128 may also be coupled to one or more analog-to-digital (A/D) converters 106, which receive analog data signals from sensors.

Data interface device 130 provides for communication between controller 32 and an external device, such as a computer, a laptop or a computer network for example, in a data communications protocol, such as but not limited to USB (universal serial bus) or JTAG (joint test action group) for example, supported by the external device. ROM device 605 stores an application code, e.g., main functionality firmware, including initializing parameters, and boot code, for processor 104. Application code also includes program instructions for causing processor 104 to execute any operation control methods, including starting and stopping operation, changing operational states of valve 64, 82, monitoring predetermined operating parameters such as measurements by sensors 70-78, 88-96, and generation of data signals.

NVM device 126 is any form of non-volatile memory such as an EPROM (Erasable Programmable Read Only Memory) chip, a flash memory chip, a disk drive, or the like. Stored in NVM device 126 are various operational parameters for the application code. The various operational parameters can be input to NVM device 126 either locally, using a user interface (not shown) or remotely via the data interface 130. It will be recognized that application code can be stored in NVM device 126 rather than ROM device 124.

Controller 104 includes operation control methods embodied in application code. These methods are embodied in computer instructions written to be executed by processor 104, typically in the form of software. The software can be encoded in any language, including, but not limited to, machine language, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC, ActiveX, HTML (HyperText Markup Language), and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

During operation, the controller 32 receives signals required for normal operation and in particular for the control of the temperature of evaporators 40, 42. The inputs include temperature sensors 70-78, 88-96, and speed sensors 110, 112, 116 from compressors 62, 80 and blower 46. Based upon these inputs, the controller 32 provides signals to the motor controllers (not shown) for compressors 62, 80 and the motor controllers (not shown) of stepper motors 65, 85 associated with expansion valves 64, 82 respectively. The controller 32 operates the two cooling loops 54, 56 independently from each other to maintain the respective evaporators 40, 42 at the desired temperatures. In one embodiment, the evaporators are maintained at a temperature between 27-31° C.

To maintain the evaporators at the desired temperature, controller 32 adjusts the speed of the compressor and the position of the expansion valve. It is also desirous that the controller 32 further operates the cooling loops 54,56 in a manner that increases the reliability of the components (e.g. compressor and expansion valve) to minimize the potential for unscheduled maintenance. For example, the controller 32 may accomplish higher reliability by controlling the temperature of the low pressure gas entering the compressor. This improves the oil flow within the compressor and refrigeration fluid flow within the cooling loop. One advantage of the embodiments disclosed herein over prior art refrigeration systems, is that in providing separate cooling loops for the cooling of individual MCM's, the operating parameters of the individual cooling loops may more closely match the desired performance, reliability and efficiency characteristics. Further, this may be accomplished in a more compact packaging arrangement that minimizes the impact of the refrigeration system on the facility in which the computer system 20 is installed.

For example, during normal operation, an individual MCM may generate between 1000-2000 Watts of thermal energy that needs to be dissipated by the cooling module 26. Since prior art refrigeration systems utilized a single compressor for more than one cooling loop, the compressor and condenser needed to perform over a range of 1000-4000 Watts (for two cooling loops in the exemplary embodiment). When operating at the lower end of the performance range, prior art systems restricted flow of refrigerant through the compressor. This restriction of flow adversely impacted both the efficiency of the systems and the reliability of the compressor resulting in increased maintenance. By utilizing individual cooling loops for each MCM Node 22, 24, the individual loop only needs to perform over the range of the individual MCM that it supports. This allows the controller 32 to operate the compressors 62, 80 at a speed and the expansion valves 64, 82 at positions that allows desirable reliability and efficiency performance.

The use of multiple cooling loops 54, 56 provide further advantages in the maintenance of the cooling module 26. Each, expansion valve 64, 82 includes an adjustable orifice that is coupled to an electromechanical actuator, such as a stepper motor 65 for example. The adjustment of the orifice allows the controller 32 to change the pressure of the liquid/gas entering the evaporators 40, 42 and thus the cooling of the MCM's 100, 102. During operation, paraffin particulate may condensate out of the refrigerant forming a benign contaminant in the cooling loop. While the paraffin does not directly affect performance of the evaporators 40, 42, due to the temperatures and pressures of the refrigerant near the expansion valve 64, 82, the particulate has a tendency to collect near the expansion valve orifice. Over time, the collection of paraffin may affect the opening and closing of the orifice, or in particular the ability of the controller 32 to know the size of the orifice.

Generally, the controller 32 does not directly measure the size of the orifice opening, but rather determines the size of the orifice based on the operation of the valve's actuator. For example, by knowing the characteristics of a stepper motor 65 and the drive train that couples the motor to the orifice, the controller 32 may calculate the size of the orifice. The calculation generally is from a known starting location. While the paraffin will not generally stop or seize the movement of the orifice, the build up of paraffin may hinder the movement of the orifice sufficiently to cause deviations between the calculated size and the actual size. To remedy this situation, periodic maintenance is performed to clear the paraffin build up.

This maintenance procedure generally requires the stopping of operation of the cooling loop upon which maintenance is being performed, cooling loop 54 for example. To calibrate the controller 32 and expansion valve 64, the controller 32 activates the expansion valve 64 stepper motor 65 until the orifice is completely closed. The controller may be able to determine the closure of the orifice through measurement of motor current for example. Alternatively, the temperatures downstream from valve 64 may indirectly measure closure of the orifice, by sensor 78 or sensor 70 for example. Once the orifice is completely closed, the controller 32 once again has a known starting position for the calculation of the orifice size. Completely closing to a known starting value may also physically clear the paraffin particulate. In one embodiment, the calibration may be performed while the system 20 continues operation with the air handling modules 33, 34, providing supplemental cooling while the orifice is closed.

The use of multiple cooling loops 54, 56 provides further advantages over the prior art in the operation and maintenance of the computer system 20. Since the cooling loop, such as cooling loop 54 for example, needs to halt operation during maintenance activities, the associated MCM, MCM 100 for example, would need to cease operation. Alternatively, the MCM 100 may decrease performance to allow a backup system, such as by air handling modules 33, 34 for example, to provide for cooling. With prior art systems, all MCM's cooled by the cooling module 26 would need to halt or reduce performance. Thus the utilization of separate cooling loops 54, 56 allows MCM 102 to continue full operational capability while maintenance is simultaneously performed on the adjacent MCM 100. This provides advantages in minimizing the operational impact of maintenance on the system operator and provides flexibility balancing the performance of maintenance activities with the business requirements. These advantages are provided while maintaining a small physical footprint through the sharing of common components, such as condenser 44, blower 46 and controller 32. It should be appreciated that controller 32 may simultaneously operate one cooling loop while performing maintenance on the other cooling loop.

The use of multiple cooling loops in a single cooling module 26 having shared components and control also provides other modes of operation that allows the controller 32 to adjust the operation of one cooling loop to accommodate additional demands on the other loop. In certain circumstances, one of the MCM's, such as MCM 102 for example, may have additional processing demands placed on it. For example, if the MCM 102 is providing processing services for a travel reservation system, there may be peak periods when users are seeking to book travel arrangements. This additional processing may result in increased heat load by the MCM 102, or alternatively, the system operator may want increased processing speed that requires a cooler evaporator 42 temperature. Upon sensing this addition demand, the controller 32 may alter the operation of cooling loop 54, by gradually increasing the temperature of evaporator 40 for example. By reducing the absorption of thermal energy of cooling loop 54, the condenser 44 will have increased capacity to absorb the increased loads on cooling loop 56.

It should be appreciated that the altering of cooling loop 54 operations may be accomplished in other manners. For example, a controller (not shown) in computer system 20 may transmit a signal to controller 32 that a change in operation is required. The two-way communication between the controller 32 and a computer system controller 20 may provide for a coordination that optimizes the performance of the overall system. For example, upon determining that MCM 102 has increased demand, the MCM 100 may be instructed to reduce the processing speed of integrated circuit assembly 100 and thus reduce heat load on evaporator 40. As discussed above, this would increase the capacity of condenser 44 to accommodate the needs of cooling loop 56.

Figure 6:
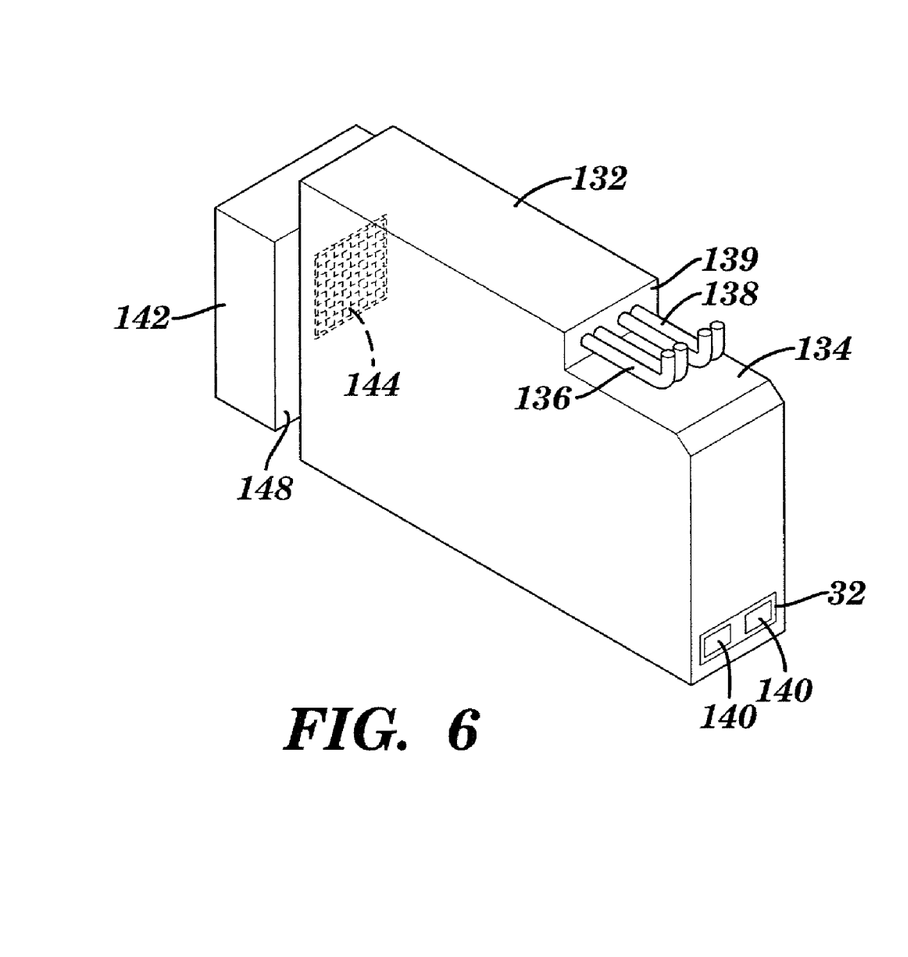
FIG. 6 is a perspective view illustration of a modular cooling system for use with the computer system of FIG. 1.
Figure 7:
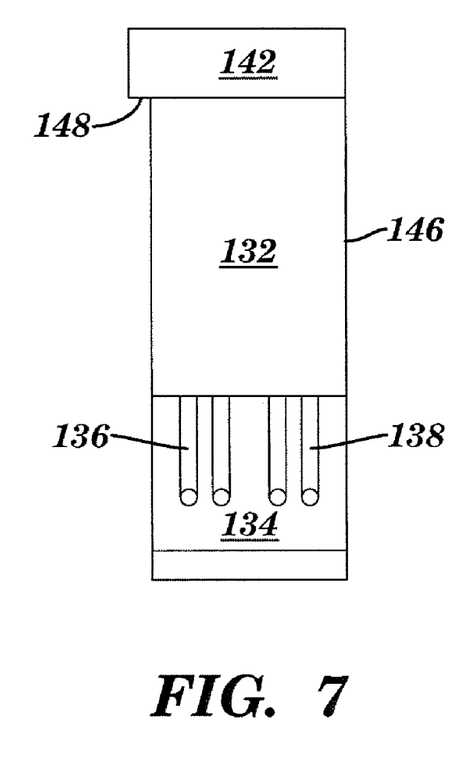
FIG. 7 is a top plan view of the modular cooling system of FIG. 6.

An alternate embodiment cooling module 26 is illustrated in FIG. 6 and FIG. 7. In this embodiment, the cooling loops 54, 56 are contained within a housing 132. The housing 132 is generally sized to fit within the footprint of two MCM's. In this embodiment, the housing is 0.44 meters (17.5 inches) high, 0.28 meters (11 inches) wide, and 0.92 meters (36 inches) in length. The housing 132 includes a recessed area 134 that allows conduit pairs 136, 138 to exit the housing through a sidewall 139. The conduit pairs 136, 138 each form part of the cooling loops 54, 56 respectively and allow the cooling loops 54, 56 to connect to the portions of the cooling loops internal to the MCM Node's 22, 24. The conduits in conduit pairs 136, 138 may also include components for removably coupling the conduits with mating conduits in the MCM Node's 22, 24, by a quick connect for example. The housing 132 may further include a slot that allows the controller 32 to be removably installed in the housing 132. In this embodiment, the controller 32 includes vents 140 that allow air to be draw into the housing 132 through the controller 32. A blower 142 is coupled to the housing 132 opposite the controller 32. A vent 144 in the rear wall of the housing 132 allows exhaust air to exit the housing 132. During operation, the blower 142 rotates a fan or similar device to pull air through vents 140 into the interior of the housing, past the condenser 44 and through the vent 144. By this arrangement, a single blower 142 allows the cooling of the controller and the cooling loops 54, 56.

In one embodiment, the blower 142 is larger than the width of the housing 132. This may occur for example, by utilizing a standard commercially available blower 142 rather than a blower designed specifically for the cooling module 26. By offsetting the blower 142 and allowing one edge of the blower 142 to align with a side 146 of housing 132, an offset portion 148 extends from the side of the housing 132. By aligning the edge of the blower 142 with the side of the housing 146, two computer systems 20 may be installed side by side while allowing the use of a more cost effective commercially available blower 142.

Figure 8:
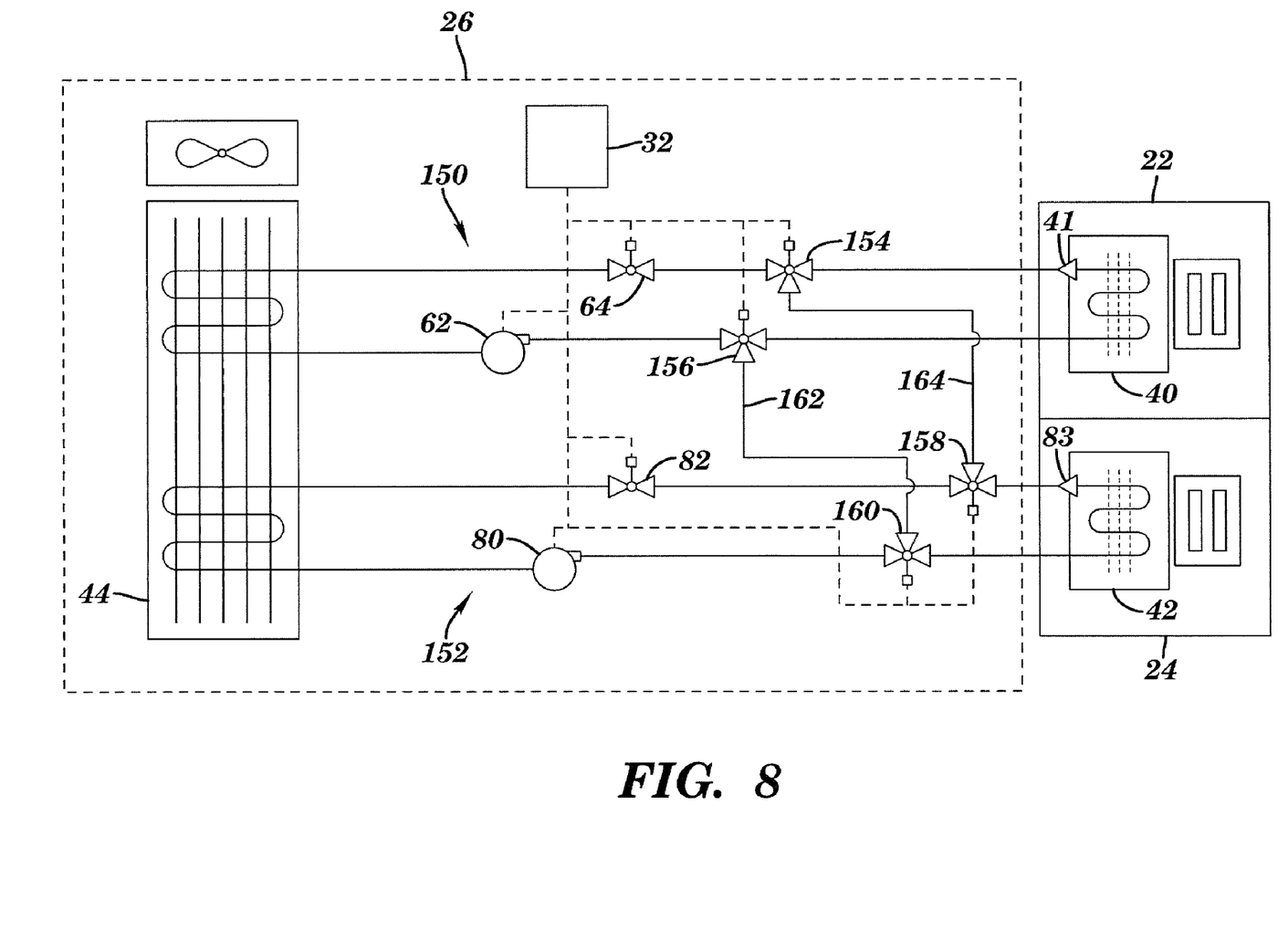
FIG. 8 is a schematic illustration of an alternate embodiment cooling system for the computer system of FIG. 1.

Another alternate embodiment cooling module 26 is illustrated in FIG. 8. In this embodiment, the cooling module 26 includes a first cooling loop 150 and a second cooling loop 152. The first cooling loop 150 is arranged in a circuit comprising a compressor 62, condenser 44, expansion valve 64 and evaporator 40 as described above in reference to the exemplary embodiment. In this embodiment, there is an additional valve 154, such as a powered three-way valve for example, coupled between the expansion valve 64 and the evaporator 40. Another valve 156 is also coupled between the evaporator 40 and the compressor 62. The valve 156 is also a powered three-way valve. Both of the three-way valves 154, 156 are electrically coupled to the controller 32.

Similarly, the second cooling loop 152 is arranged in a circuit having a compressor 80, condenser 44, expansion valve 82 and evaporator 42. The second cooling loop 152 may optionally include three-way valves 158, 160 that are coupled between the expansion valve 82 and the evaporator 42, and between the evaporator 42 and the compressor 80 respectively. The valves 158, 160 are electrically connected to the controller 32. A conduit 162 connects valve 156 to valve 160 while a conduit 154 connects valve 154 to valve 158. It should be appreciated that the embodiment illustrated in FIG. 8 may also include temperature sensors, such as sensors 70-78 and sensors 88-96 for example. However, these temperature sensors are not illustrated for the purposes of clarity.

The embodiment of FIG. 8 provides advantages of redundancy to the cooling module 26. During operation, it is possible for either component failure, or a leak to develop that compromises the cooling capacity of a cooling loop. A leak for example, would degrade the capacity of cooling loop until it reached a point where the cooling loop would be unable to maintain the desired temperature of the evaporator. At this point, the MCM would need to be shut down to avoid damaging the integrated circuit assembly and other heat sensitive components within the MCM.

In certain embodiments, the system operator may elect to only install one MCM. This may be done for a variety of reasons, since the MCM's are generally modular, the system operator may only install the MCM's as the capacity of their existing equipment reaches the limits of its capability. In this embodiment, the second cooling loop is fully redundant. Since the cooling loops 150, 152 are coupled by the three-way valves, upon the detection of the failure, the controller 32 may switch valves 154, 156, 158 and 160 to allow the flow of refrigerant from the second cooling loop to the first cooling loop evaporator 40. This would enable the operation of the MCM 100 until service personnel can be dispatched and the first cooling loop 150 is repaired. It should be appreciated that when the valves 154, 156 are switched to allow refrigerant flow from cooling loop 152, the valves 154, 156 isolate the failed portion of the first cooling loop 150 to prevent the failure from disrupting the operation of the second cooling loop 152.

In an embodiment where both the MCM Node 22 and the MCM Node 24 are present, the three-way valves may still provide redundant backup for a failure in one of the cooling loops. When both MCM Node's 22, 24 are present, the capacity of the remaining cooling loop may not be sufficient to provide full cooling capacity for both MCM Node's 22, 24. However, as discussed above, the controller 32 may coordinate with other controllers in the computer system 20 to alter the performance of the system to allow continued operation. For example, upon a failure of the second cooling loop 152, the controller 32 may signal a controller in MCM Node 22 and MCM Node 24 indicating that the available cooling capacity has been reduced. The MCM 22 and 24 may then degrade the operation of integrated circuit assemblies 100, 102 to allow higher evaporator temperatures. The controller 32 can then activate valves 154, 156, 158, 160 allowing the first cooling loop to provide a cooling to both evaporator 40 and evaporator 42.

While embodiments described herein depict the interconnection of a cooling system with multiple MCM's, it will be appreciated that the disclosed invention is also applicable to the interconnection of other electronic devices housed in MCMs or SCMs (single chip module), or other types of first level packaging. For example, embodiments of the invention may be employed for interconnecting the core switches within a large-scale internet switch, or router, with the network processors in the router's line cards. Similarly, other electronic systems requiring dense interconnection of electronic chips mounted on MCMs or SCMs or other types of first level packaging at a high aggregate bandwidth may benefit from embodiments of the invention.

The capabilities of the embodiments disclosed herein can be implemented in software, firmware, hardware or some combination thereof. As one example, one or more aspects of the embodiments disclosed can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the disclosed embodiments can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A computer system comprising:
   a first multiple chip module (MCM);
   a second MCM positioned adjacent said first MCM;
   a first evaporator thermally coupled to said first MCM, said first evaporator including a first expansion orifice;
   a second evaporator thermally coupled to said second MCM, said second evaporator including a second expansion orifice;
   a condenser thermally coupled to said first evaporator and said second evaporator;
   a first cooling loop coupled between said condenser and said first evaporator, said first cooling loop having a first expansion valve;
   a second cooling loop coupled between said condenser and said second evaporator, said second cooling loop having a second expansion valve; and,
   a refrigeration controller operably coupled to said first expansion valve and said second expansion valve, said refrigeration controller having a processor responsive to executable computer instructions when executed on said processor for determining increase in demand of said first MCM and transmitting a first signal to said second expansion valve to increase a first operating temperature of said second evaporator in response to said determining of increased demand.

2. The computer system of claim 1 further comprising:
   a first stepper motor operably coupled to said first expansion valve and electrically coupled to said refrigeration controller; and,
   a second stepper motor operably coupled to said first expansion valve and electrically coupled to said refrigeration controller;
   wherein said first signal is transmitted to said second stepper motor.

3. The computer system of claim 2 wherein said refrigeration controller is responsive to computer executable instructions to transmit a second signal to said first stepper motor in response to an increase in temperature of said second MCM.

4. The computer system of claim 2 further comprising:
   an air handler directly thermally coupled to said first MCM and said second MCM;
   wherein said processor is responsive to computer executable instructions when executed on said processor to periodically and aperiodically operate said air handler and to calibrate said first expansion valve by transmitting a signal to said first stepper motor to close said first expansion valve.

5. The computer system of claim 2 wherein said first cooling loop and said second cooling loop are fluidly coupled by a valve that is electrically coupled to said refrigeration controller, wherein said controller is responsive to computer executable instructions to transfer refrigerant from said first cooling loop to said second evaporator in response to a signal from a temperature sensor coupled to said second cooling loop.

6. A method of operating a computer cooling system having a first MCM and a second MCM, said method comprising:
   compressing a first refrigeration fluid in a first cooling loop to a high pressure gas;
   condensing said first refrigerant to a high pressure liquid with a condenser;
   expanding said first refrigeration fluid from a high pressure liquid to a first low pressure liquid with a first expansion valve;
   expanding said first refrigerant fluid from said first low pressure liquid to a second low pressure liquid with a first orifice;
   absorbing thermal energy from said first MCM into said second low pressure liquid to form a low pressure gas;
   compressing a second refrigeration fluid in a second cooling loop to a high pressure gas;
   condensing said second refrigerant to a high pressure liquid with said condenser;
   expanding said second refrigeration fluid from a high pressure liquid to a third low pressure liquid with a second expansion valve;
   expanding said second refrigerant from said third low pressure liquid to a fourth low pressure liquid with a second orifice;
   absorbing thermal energy from said second MCM into said fourth low pressure liquid to form a low pressure gas;
   changing the compression and expansion characteristics of said second refrigeration fluid to reduce the absorption of thermal energy from said second MCM in response to an increase in thermal energy produced by said first MCM.

7. The method of claim 6 further comprising the step of controlling the temperature of said first refrigeration fluid second low pressure gas prior to compressing said first refrigeration fluid.

8. The method of claim 6 further comprising the steps of:
   operating an air handler to directly remove thermal energy from said first MCM and said second MCM;
   closing said first expansion valve after operating said air handler; and,
   calibrating a controller to said first expansion valve.

9. The method of claim 6 further comprising:
transferring said first refrigerant second low pressure liquid to said second evaporator;
receiving said first refrigerant low fourth pressure gas from said second evaporator.

10. The method of claim 9 further comprising:
receiving a signal indicative of the temperature of said second evaporator;
absorbing thermal energy from said second evaporator with said first refrigerant fluid when said second evaporator temperature rises above a predefined threshold.

11. The method of claim 6 further comprising:
measuring an inlet temperature and an outlet temperature of said condenser; and,
changing the size of an orifice in said first expansion valve in response to said outlet temperature increasing above a predefined threshold.

12. The computer system of claim 2 wherein said processor reduces the absorption of thermal energy in said second evaporator to maintain said first evaporator at a second operating temperature between 27° C.-31° C.

13. The computer system of claim 12 wherein said second operating temperature is 29° C.

* * * * *